US006777786B2

(12) United States Patent
Estacio

(10) Patent No.: US 6,777,786 B2
(45) Date of Patent: Aug. 17, 2004

(54) SEMICONDUCTOR DEVICE INCLUDING STACKED DIES MOUNTED ON A LEADFRAME

(75) Inventor: Maria Cristina B. Estacio, Cebu (PH)

(73) Assignee: Fairchild Semiconductor Corporation, South Portland, ME (US)

( * ) Notice: Subject to any disclaimer, the term of this patent is extended or adjusted under 35 U.S.C. 154(b) by 0 days.

(21) Appl. No.: 09/805,597

(22) Filed: Mar. 12, 2001

(65) Prior Publication Data

US 2002/0125550 A1 Sep. 12, 2002

(51) Int. Cl.[7] .................................................. H01L 23/495
(52) U.S. Cl. ........................ 257/666; 257/676; 257/670
(58) Field of Search ................................ 257/666–676, 257/686, 685

(56) References Cited

U.S. PATENT DOCUMENTS

| | | | | | |
|---|---|---|---|---|---|
| 4,514,750 | A | * | 4/1985 | Adams | 357/70 |
| 4,791,473 | A | * | 12/1988 | Phy | 357/70 |
| 5,105,536 | A | | 4/1992 | Neugebauer et al. | |
| 5,233,131 | A | * | 8/1993 | Liang et al. | 174/52.4 |
| 5,286,679 | A | * | 2/1994 | Farnworth et al. | 437/209 |
| 5,512,781 | A | * | 4/1996 | Inoue | 257/676 |
| 5,544,412 | A | * | 8/1996 | Romero et al. | 29/832 |
| 5,763,952 | A | * | 6/1998 | Lynch et al. | 257/735 |
| 5,789,803 | A | * | 8/1998 | Kinsman | 257/666 |
| 5,986,209 | A | * | 11/1999 | Tandy | 174/52.4 |
| 6,040,626 | A | * | 3/2000 | Cheah et al. | 257/735 |
| 6,066,515 | A | * | 5/2000 | Schoenfeld | 438/123 |
| 6,081,031 | A | * | 6/2000 | Letterman, Jr. et al. | 257/730 |
| 6,198,163 | B1 | | 3/2001 | Crowley et al. | |
| 6,215,176 | B1 | * | 4/2001 | Huang | 257/666 |
| 6,344,687 | B1 | * | 2/2002 | Huang et al. | 257/724 |
| 6,373,078 | B1 | * | 4/2002 | Yea | 257/81 |
| 6,399,418 | B1 | | 6/2002 | Glenn et al. | |
| 6,452,278 | B1 | | 9/2002 | DiCaprio et al. | |
| 6,476,474 | B1 | * | 11/2002 | Hung | 257/686 |
| 2001/0048116 | A1 | * | 12/2001 | Standing et al. | 257/177 |
| 2002/0071253 | A1 | * | 6/2002 | Lam et al. | 361/704 |
| 2002/0086748 | A1 | * | 7/2002 | Pavier | 257/670 |
| 2003/0025183 | A1 | | 2/2003 | Thornton et al. | |

FOREIGN PATENT DOCUMENTS

JP          409116070     *  5/1997    ........... H01L/23/50

OTHER PUBLICATIONS

U.S. patent application Ser. No. 09/464,885, Joshi et al., Dec. 16, 1999.

"IR's New Synchronous Rectifier Chip Set Meets New Efficiency Standard for DC–DC Converters to Power Notebook PC Processors Through 2000," International Rectifier Company Information. Retrieved from the World Wide Web at http://www.irf.com/whats–new/nr990402.html on Jul. 29, 2003.

* cited by examiner

Primary Examiner—Mary Wilczewski
Assistant Examiner—Monica Lewis
(74) Attorney, Agent, or Firm—Townsend and Townsend and Crew LLP

(57) ABSTRACT

A semiconductor device including a leadframe and two stacked dies, a first of which is on a top surface of a leadframe while the second one is on a bottom surface of the leadframe. The drain region of the first die is coupled to a drain clip assembly that includes a drain clip that is in contact with a lead rail. The body of the semiconductor device includes a window or opening that exposes the drain region of the second die.

6 Claims, 3 Drawing Sheets

SEMICONDUCTOR DEVICE INCLUDING STACKED DIES MOUNTED ON A LEADFRAME

BACKGROUND OF THE INVENTION

1. Background of the Invention

The present invention relates to a semiconductor device, and more particularly, to packaging techniques for semiconductor devices that include a package that can accommodate dual stacked dies.

2. Description of the Prior Art

Many of the applications for today's semiconductor devices require more and more power or capacity. However, today's applications also prefer semiconductor packages that are compact and thin. Finally, a concern in improving semiconductor devices includes maintaining very low package resistance (RDSon).

SUMMARY OF THE INVENTION

The present invention provides a semiconductor device that includes a leadframe that has a first source attach area on a first surface of the leadframe and a first gate attach area along with a second source attach area on a second surface of the leadframe and a second gate attach area. The device also includes two dies, a first of which is coupled to the first source and gate attach areas, while a second of which is coupled to the second source and gate attach areas. A drain connection assembly is coupled to a drain region of the first die and a body is coupled to the semiconductor device such that a drain region of the second die is exposed.

In accordance with one aspect of the present invention, the dies are bumped dies.

In accordance with another aspect of the present invention, the drain connection assembly includes a drain clip and a lead rail adjacent an edge of the drain clip.

The present invention also provides a method of making a semiconductor device.

Other features and advantages of the present invention will be understood upon reading and understanding the detailed description of the preferred exemplary embodiments found herein below, in conjunction with reference to the drawings, in which like numerals represent like elements.

DETAILED DESCRIPTION OF THE SPECIFIC EXEMPLARY EMBODIMENTS

A semiconductor device 10 includes a leadframe 11, which includes a plurality of leads 12, and a body 13.

Figure 3:
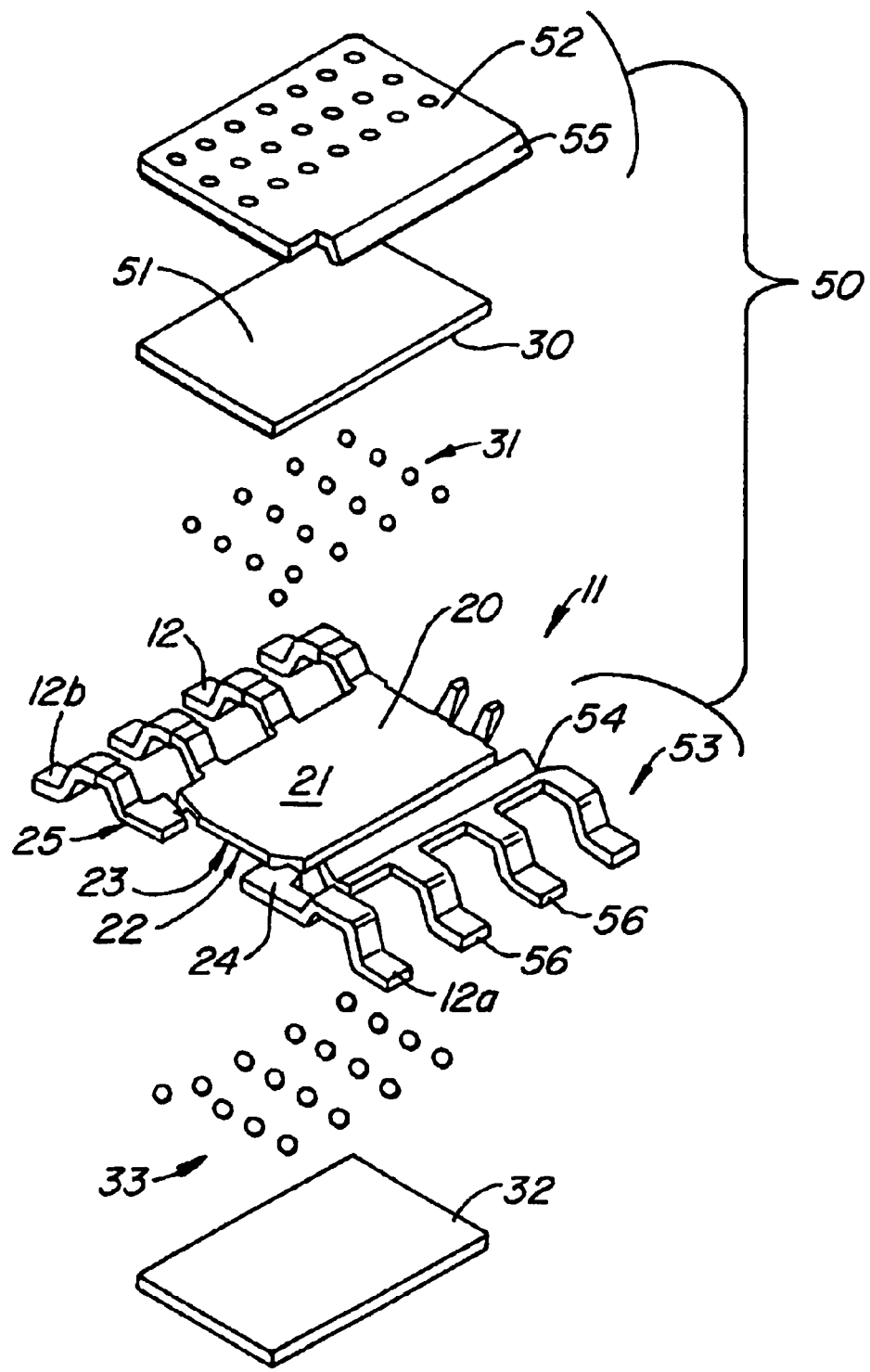
FIG. 3 is an exploded view of a semiconductor device in accordance with the present invention.

In accordance with the present invention, and as can be seen in FIG. 3, the leadframe 11 preferably includes a first source attach area 20 on a top surface 21 and a second source attach area 22 on a bottom surface 23 of the leadframe. First and second gate attach areas 24, 25 are included and have at least one lead 12a and 12b extending therefrom, respectively. Preferably, the gate attach areas are separate from the source attach areas. They may, however, be electrically isolated in another manner.

A first die 30 is coupled to first source and gate attach areas 20, 24. Preferably, this is accomplished with solder bumps 31. Likewise, a second die 32 is coupled, preferably with solder bumps 33 to second source and gate attach areas 22, 25.

Figure 4:
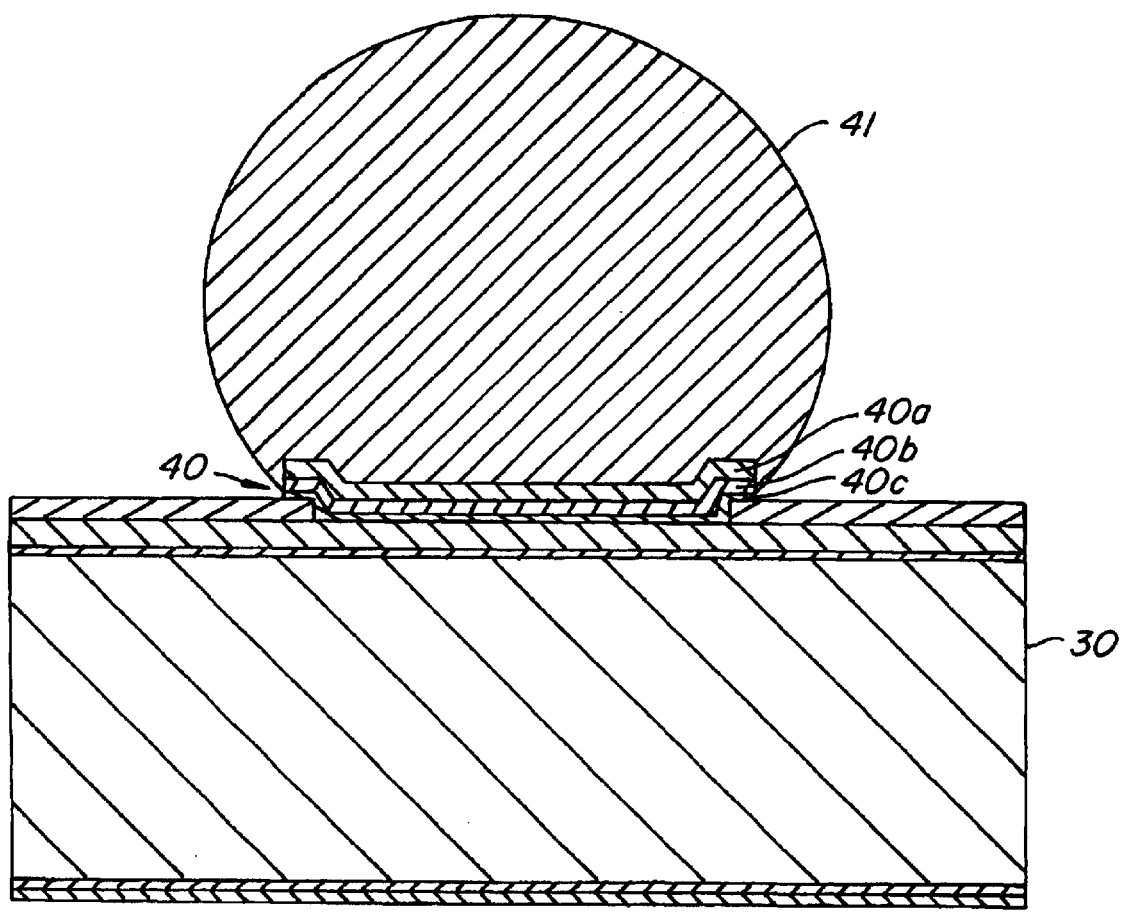
FIG. 4 is a side sectional view of a bumped die.

In accordance with a preferred embodiment of the present invention, dies 30, 32 are bumped dies, which are one-piece items. As can be seen in FIG. 4, a bumped die includes the die, an "under bump" material 40 that serves as an intermediate layer between the top surface of the die and solder bump 41. Preferably, the under bump material is one of TiW, Cu, Au or an equivalent. In the example illustrated in FIG. 4, the under bump material is broken into three layers—Cu plating 40a, sputtered Cu 40b, and sputtered Ti 40c.

A drain clip assembly 50 is attached to drain region 51 of the first die preferably with solder. The drain clip assembly includes a top die drain clip 52 and a side rail leadframe 53. Solder paste is dispensed on the drain region of the first die and into elongated v-groove 54 in side rail 53. Clip 52, preferably comprising copper, is supplied, (preferably in reel form) and pick-and-placed onto the die backside such that edge 55 of the copper clip is placed within the elongated v-groove. Thus, the clip provides contact with the first die's drain regions and couples these drain regions to leads 56 of the side rail.

Finally, the package or body 13 is placed around the semiconductor device with the leads exposed therethrough. Preferably, the body comprises a two-piece, molded plastic package.

Figure 2:
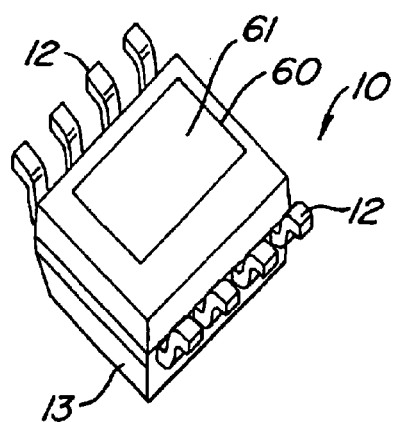
FIG. 2 is a bottom perspective view of a semiconductor device in accordance with the present invention.

As can be seen in FIG. 2, the bottom of the body includes a window or opening 60 defined therein, thus exposing drain region 61 of the bottom die. Accordingly, when the semiconductor device is used, the drain region of the second die is coupled directly to a circuit board.

Figure 1:
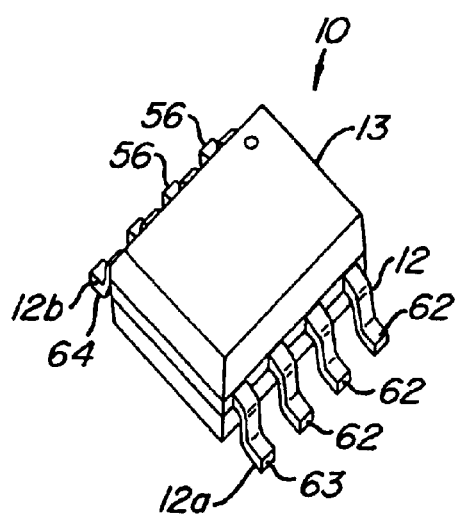
FIG. 1 is a top perspective view of a semiconductor device in accordance with the present invention.

As can be seen in FIG. 1, leads 62 serve as the common source connections while leads 56 serve as the drain connections for the first or top die. Lead 12a serves as the gate connection for the first die while lead 12b serves as the gate connection for the second die. Parallel connection of the top and bottom dies may be specially routed on the circuit board for optimum electrical performance. Isolating the connections of the top and bottom dies may be an option depending upon the device application.

Preferably, the leadframe comprises copper. As noted above, the top die drain clip preferably also comprises copper.

In accordance with one embodiment of the present invention, a semiconductor device is manufactured by flipping the second or bottom die onto the source and gate attach areas with pre-dispensed flux to facilitate the first pass reflow process. The solder bumps are then reflowed to couple the die to the leadframe. The leadframe with the bottom die will then undergo a second flip chip attach process. This second flipchip attach process takes care of the top die connection to its designated source and gate areas. This will likewise, undergo a second pass reflow which is done at a lower temperature compared to the first pass so that the solder of the first flipchip attach process does not reflow. The drain clip is then flipped onto the drain region of the top die. The drain clip attachment is done at a temperature lower than the second pass reflow process to prevent the previous solder additions from reflowing. The drain clip connection may be accomplished by a solder paste or a conductive adhesive. The body is then placed around the semiconductor device. As noted previously, preferably the body is a piece molded package. The two pieces are preferably coupled to one another through a transfer molding process.

As is known in the industry, the semiconductor device is then completed by degating, debarring and dejuncting the semi-completed semiconductor device. The semiconductor device is deflashed, the body is marked, if desired, and the leads are plated. The leads are also trimmed and formed.

In accordance with an alternative embodiment of the present invention, the semiconductor device is manufactured in a substantially similar manner. However, instead of reflowing the solder upon placement of the top or first die on the source and gate attach regions, the solder is not reflowed until after the drain clip is placed on the drain region of the top die. Thus, the solder bumps between the top die and the leadframe with pre-dispensed solder paste in between them and the drain clip and the top die, also with pre-dispensed solder paste between them, are reflowed at the same time. Other conductive adhesives can be used as an alternate to the solder paste.

Thus, the present invention provides a semiconductor device that includes two dies stacked with the leadframe therebetween, thus providing a common source region. Such a parallel connection of the first and second chip doubles the silicon performance of the largest chip that generally may be accommodated in typical semiconductor packages while maintaining generally existing package layouts.

Generally, since two chips are accommodated inside the package, the total affected chip size equivalent to approximately 16.8 square millimeters. This generally equates to a 30 percent increase in the number of trench cells within the package, which generally translates to better RoSon and thermal performance.

Although the invention has been described with reference to specific exemplary embodiments, it will be appreciated that it is intended to cover all modifications and equivalents within the scope of the appended claims.

What is claimed is:

1. A semiconductor device comprising:

a. a leadframe including a plurality of leads, a first source attach area on a first surface of the leadframe and a first gate attach area, and a second source attach area on a second surface of the leadframe and a second gate attach area;

b. at least two dies, a first die being electrically coupled to the first source and gate attach areas of the leadframe and a second die being electrically coupled to the second source and gate attach areas of the leadframe;

c. a drain connection assembly coupled to a drain region of the first die; and, d. a body being around at least a portion of the first die and the second die, such that at least a drain region of the second die is exposed by the body, wherein the first and second dies are in a stacked relationship and are at opposite sides of the leadframe, and wherein the drain region of the first die faces away from the leadframe and the drain region of the second die faces away from the leadframe.

2. A semiconductor device in accordance with claim 1 wherein at least one of the dies is a bumped die.

3. A semiconductor device in accordance with claim 2 wherein both dies are bumped dies.

4. A semiconductor device in accordance with claim 1 wherein the drain connection assembly comprises a drain clip and a side rail structure adjacent an edge of the drain clip.

5. A semiconductor device in accordance with claim 1 wherein the drain connection assembly comprises a drain clip and a side rail structure adjacent an edge of the drain clip, and wherein the side rail comprises a v-groove.

6. A semiconductor device in accordance with claim 1 wherein the drain connection assembly comprises a drain clip and a side rail structure adjacent an edge of the drain clip, and wherein the side rail comprises a v-groove, and wherein the drain clip comprises copper.

* * * * *